(12) United States Patent
van den Oever et al.

(10) Patent No.: US 8,686,752 B2
(45) Date of Patent: Apr. 1, 2014

(54) LOW-CURRENT LOGIC PLUS DRIVER CIRCUIT

(75) Inventors: Léon C. M. van den Oever, Rosmalen (NL); Erwin Spits, Utrecht (NL)

(73) Assignee: EPCOS AG, Munich (DE)

( * ) Notice: Subject to any disclaimer, the term of this patent is extended or adjusted under 35 U.S.C. 154(b) by 41 days.

(21) Appl. No.: 13/457,244

(22) Filed: Apr. 26, 2012

(65) Prior Publication Data
US 2012/0268166 A1 Oct. 25, 2012

Related U.S. Application Data

(63) Continuation of application No. PCT/EP2009/065760, filed on Nov. 24, 2009.

(51) Int. Cl.
*H03K 19/094* (2006.01)

(52) U.S. Cl.
CPC .................. *H03K 19/09421* (2013.01)
USPC .................. 326/25; 326/83; 326/117

(58) Field of Classification Search
CPC .............. H03K 19/094; H03K 10/096; H03K 19/09421
USPC ............................................. 326/82, 83, 115
See application file for complete search history.

(56) References Cited

U.S. PATENT DOCUMENTS

| | | | | |
|---|---|---|---|---|
| 4,716,311 A | * | 12/1987 | Davenport et al. | 326/117 |
| 4,798,978 A | * | 1/1989 | Lee et al. | 326/25 |
| 4,896,057 A | * | 1/1990 | Yang et al. | 326/116 |
| 4,926,071 A | | 5/1990 | MacMillan et al. | |
| 5,008,565 A | | 4/1991 | Taylor | |
| 5,726,591 A | * | 3/1998 | Miyashita | 326/117 |
| 2002/0153926 A1 | | 10/2002 | Yoshizawa | |
| 2011/0227066 A1 | * | 9/2011 | Umezaki | 257/43 |

FOREIGN PATENT DOCUMENTS

| | | |
|---|---|---|
| GB | 1 436 988 A | 5/1976 |
| JP | 56-093431 A | 7/1981 |
| JP | 59-055627 A | 3/1984 |
| JP | 64-071219 A | 3/1989 |
| JP | 02-280413 A | 11/1990 |
| JP | 05-276015 A | 10/1993 |
| JP | 06-209258 A | 7/1994 |

OTHER PUBLICATIONS

White, W., et al., "Design and Application of a GaAs Digital RF Memory Chip," IEEE Journal of Solid-State Circuits, No. 4, Aug. 1990, pp. 961-969, New York, US.

Chandramouli, V., et al., "A New, Precharged, Low-Power Logic Family for GaAs Circuits," IEEE Journal of Solid-State Circuits, No. 2, Feb. 1995, pp. 140-143, New York, US.

* cited by examiner

*Primary Examiner* — Don Le
(74) *Attorney, Agent, or Firm* — Slater & Matsil, L.L.P.

(57) ABSTRACT

A circuit includes a logic stage, an inverter stage, and a driver stage. The logic stage and the inverter stage are provided with current limiters, which include a D-mode feedback transistor and a component that generates a voltage drop. A feedback loop connects the source and the gate of the D-mode feedback transistor via this component. The driver stage includes E-mode transistors connected in a totem pole that drive a D-mode transistor and an E-mode transistor to connect and disconnect the load circuit.

21 Claims, 1 Drawing Sheet

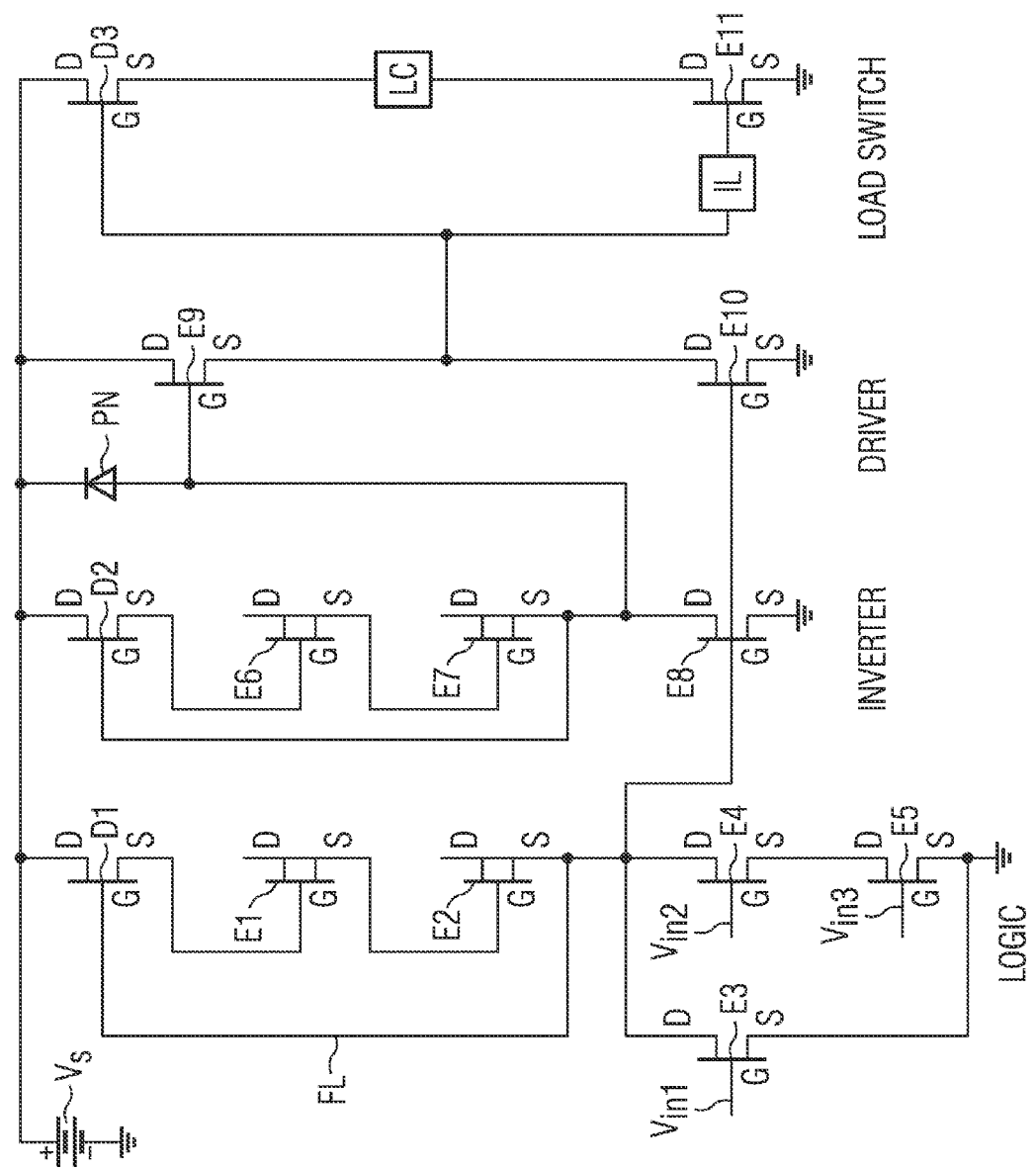

LOW-CURRENT LOGIC PLUS DRIVER CIRCUIT

This application is a continuation of co-pending International Application No. PCT/EP2009/065760, filed Nov. 24, 2009, which designated the United States and was published in English, which application is incorporated herein by reference.

TECHNICAL FIELD

This invention relates to low-current logic plus driver circuits for applications in GaAs technology.

BACKGROUND

Conventional logic circuits in GaAs technology use a transistor in combination with a large resistor. These circuits require both high input drive currents and high currents in the on-state because of the required voltage drop over the resistor. Furthermore, the resistor occupies a large chip area to provide the desired large resistance.

SUMMARY OF THE INVENTION

In one aspect the present invention provides a low-current logic plus driver circuit which can be realized in GaAs technology.

The low-current logic plus driver circuit comprises a logic stage, an inverter stage, and a driver stage. The logic stage is provided with a current limiter, which comprises a D-mode feedback transistor having a source, a drain, a gate, and a gate-source junction and further comprises a component that generates a voltage drop. A feedback loop connects the source of the D-mode feedback transistor to the gate of the D-mode feedback transistor via the component that generates a voltage drop. The inverter stage is provided with a further current limiter. The further current limiter comprises a further D-mode feedback transistor having a source, a drain, a gate, and a gate-source junction and further comprises a further component that generates a voltage drop. A further feedback loop connects the source of the further D-mode feedback transistor to the gate of the further D-mode feedback transistor via the further component that generates a voltage drop. The driver stage comprises E-mode transistors having a source, a drain, and a gate, the E-mode transistors being connected in a totem pole.

The E-mode (enhancement mode) transistors are conducting between the source and the drain if the gate-source voltage is more positive than a positive threshold voltage and are not conducting between the source and the drain if the gain-source voltage is lower. The D-mode (depletion mode) transistors are not conducting between the source and the drain if the gate-source voltage is more negative than a negative threshold voltage and are conducting between the source and the drain in the case of a gate-source voltage above the threshold voltage (less negative, zero or positive). The transistors can have gate-source junctions and gate-drain junctions and can particularly be symmetric with respect to source and drain, so that a gate-source junction and a similar gate-drain junction are both available.

The circuit according to embodiments of the invention can be realized in GaAs technology and does not require large currents. Several components available in this technology, especially merged or stacked FET-HBT integration schemes, often called BiFET or BiHEMT and containing both HBT and FET or P-HEMT devices on a single GaAs substrate, can be used to render a low-current circuitry. The low-current circuit delivers the desired voltages while always limiting its currents to a minimum.

In an embodiment of the low-current circuit, E-mode transistors are used in the logic stage to form a logic circuit and/or in the inverter stage. To limit the current, the source of the feedback transistor is connected to the drain of an E-mode transistor via a component that generates a voltage drop. The drain of this E-mode transistor is provided for an output signal and is connected to the gate of the feedback transistor.

In the logic stage, a plurality of input E-mode transistors can be arranged to generate a desired logical output signal from logical input signals. The gates of the input E-mode transistors can be provided for the application of input signals.

A further E-mode transistor can be provided for the inverter stage. The output signal of the logic stage is applied to the gate of this further E-mode transistor. The drain of the E-mode transistor of the inverter stage can be connected with the gate of one of the E-mode transistors of the driver stage, and the gate of the E-mode transistor of the inverter stage can be connected with the gate of another one of the E-mode transistors of the driver stage.

The component that generates a voltage drop between the source of the feedback transistor and the drain of an E-mode transistor can especially be provided by a gate-source junction and/or by a gate-drain junction of a further transistor, especially a further E-mode transistor. The junctions of the further transistor may be switched in parallel by connecting source and drain. Gate-source junctions and/or gate-drain junctions of two or more further transistors can be connected in series to obtain the adequate value of the voltage drop. The component that generates a voltage drop can instead be provided by a diode, especially a diode formed by the base and the emitter or collector of a bipolar or heterobipolar transistor.

In a further embodiment, a diode is connected between a supply voltage and the gate of one of the E-mode transistors of the driver stage. The diode is used as a pull-up.

In a further embodiment, the inverter stage inverts a logical signal from the logic stage, changing the signal from high to low or from low to high, and the driver stage renders a low output signal if the signal from the inverter stage is low, and a high output signal if the signal from the inverter stage is high. The output signal of the driver stage can be used to switch a load circuit.

A further embodiment comprises a further D-mode transistor and a further E-mode transistor, the load circuit being connected between the drain of the further E-mode transistor and the source of the further D-mode transistor. The driver circuit is connected to the gates of the further D-mode transistor and the further E-mode transistor.

BRIEF DESCRIPTION OF THE DRAWINGS

These and other features and advantages of the invention will become apparent from the following detailed description in conjunction with the lone FIGURE.

The lone FIGURE shows a circuit diagram of an embodiment of the low-current logic plus driver circuit.

DETAILED DESCRIPTION OF ILLUSTRATIVE EMBODIMENTS

The lone FIGURE shows a circuit diagram with D-mode transistors D1, D2 and D3 and E-mode transistors E1 to E11, each having a source S, a drain D, and a gate G. A supply voltage $V_S$ provides the voltage levels of the circuitry, which can be typically $V_{DD}$ and $V_{SS}$ as used in CMOS circuits, for example.

The third, fourth and fifth E-mode transistors E3, E4 and E5 are shown as an example of the logic stage, which can be substituted with other arrangements of logic components. The gates G of these E-mode transistors E3, E4, E5 are provided for logical input signals represented by the applied input voltages $V_{in1}$, $V_{in2}$ and $V_{in3}$.

The logic stage is provided with a current limiter comprising the first D-mode transistor D1 as its feedback transistor and the first E-mode transistor E1 and the second E-mode transistor E2 as the component generating a voltage drop. The source S and the drain D of the first E-mode transistor E1 are connected and so are the source S and the drain D of the second E-mode transistor E2. Thereby the gate-source junction and the gate-drain junction of each E-mode transistor E1, E2 are connected in parallel. The junction of the first E-mode transistor E1 and the junction of the second E-mode transistor E2 are connected in series and thus form the component generating a voltage drop. Although the component that generates a voltage drop can generally be provided by any suitable number of devices, the transistors of a GaAs BiFET process are typically dimensioned in such a fashion that two gate-source junctions connected in series may render an appropriate value of the voltage drop in question. The source S of the first D-mode transistor D1 is connected to its gate G by the feedback loop FL via the first E-mode transistor E1 and the second E-mode transistor E2.

The current limiter secures a reliable low-current operation, irrespective of changing environmental or operating conditions. The drain D of the fourth E-mode transistor E4 is provided for an output signal and connected with the current limiter and with the E-mode transistor E8 of the inverter stage.

The inverter stage is provided with a further current limiter comprising the second D-mode transistor D2 as its feedback transistor and the sixth and seventh E-mode transistors E6, E7 forming the component generating the voltage drop. These transistors D2, E6, E7 have an analogous function as the transistors D1, E1, E2 of the current limiter of the logic stage already described and provide the current limiter of the inverter stage.

The operation of this circuit is as follows. When input voltages $V_{in1}$, $V_{in2}$, $V_{in3}$ are applied to the gates of the input E-mode transistors E3, E4, E5 of the logic stage such that the output level applied to the gate G of the eighth E-mode transistor E8 forming the inverter stage corresponds to a high voltage level, which means a high logical signal, this voltage will drive the eighth E-mode transistor E8 into a conducting mode. The voltage applied to the gate G of the eighth E-mode transistor E8 only needs to be high enough for the gate-source voltage of the eighth E-mode transistor E8 to be larger than the threshold voltage of this transistor. The corresponding switch between source S and drain D of the eighth E-mode transistor E8 is therefore closed, and the ground potential is connected with the gate G of the second D-mode transistor D2.

The voltage over the component that generates the voltage drop in the feedback loop, which is formed by the sixth and seventh E-mode transistors E6 and E7 in this embodiment, makes a current flow through the circuit branch of the series of transistors D2, E6, E7 and E8. The current through the E-mode transistors E6 and E7 causes a voltage drop, so that the voltage level at the gate G of the second D-mode transistor D2 is lower than the voltage level at the source S of the second D-mode transistor D2. The gate-source and gate-drain junctions of the E-mode transistors E6 and E7 are dimensioned such that the voltage drop causes the second D-mode transistor D2 to be switched to a region around the threshold, the gate-source voltage of the second D-mode transistor D2 being comparable to the threshold voltage. Consequently, the current flowing through the transistors D2, E6, E7 and E8 is very low, while the voltage level at the drain D of the eighth E-mode transistor E8 is essentially on ground level. Thus the high input signal at the gate G of the eighth E-mode transistor E8 is transformed into a low output signal at the drain D of the eighth E-mode transistor E8.

When a low voltage level is applied to the gate G of the eighth E-mode transistor E8, the corresponding gate-source voltage is below the threshold voltage, so that the eighth E-mode transistor E8 is non-conducting, and almost no current flows through the source-drain path of the eighth E-mode transistor E8. The only current occurring in the circuit branch of the series of transistors D2, E6 and E7 is a very small current of an output signal at the drain D of the eighth E-mode transistor E8. The sixth and the seventh E-mode transistors E6 and E7 are dimensioned in such a manner that the voltage drop over their gate-source junctions is low enough for the negative gate-source voltage of the second D-mode transistor D2 to be above the more negative threshold voltage. Therefore the second D-mode transistor D2 is conducting between source and drain, and the corresponding switch is closed. Accordingly, the output signal at the drain D of the eighth E-mode transistor E8 is on a high level. Thus a low input signal at the gate G of the eighth E-mode transistor E8 renders a high output signal at the drain D of the eighth E-mode transistor E8. This circuit therefore forms an inverter, which is current limited.

The driver stage is a totem pole, which has two inputs: one inverting and one non-inverting. An active pull-up for the inverting input is provided by the diode PN, which has very low but non-zero (reverse or leakage) current. This driver has negligible current consumption in the off-state (current less than 1 μA), high current drive capability in the on-state (load current typically 10 mA to 100 mA), and occupies only a small chip area.

In the off-state the load circuit is disconnected. The off-state is obtained when the input voltages $V_{in1}$, $V_{in2}$, $V_{in3}$ are such that the output of the logic stage is high, and the output of the inverter stage is consequently low. The gate G of the ninth E-mode transistor E9 is connected with the drain D of the eighth E-mode transistor E8 of the inverter stage and is therefore on a low voltage level, so that the ninth E-mode transistor E9 is non-conducting between source S and drain D. The gate G of the tenth E-mode transistor E10 is connected with the gate G of the eighth E-mode transistor E8 of the inverter stage and is therefore on a high voltage level, so that the tenth E-mode transistor E10 is conducting between source S and drain D. Then the output of the driver stage, namely the source S of the ninth E-mode transistor E9 and the drain D of the tenth E-mode transistor E10, is pulled to ground by the ninth E-mode transistor E9, and thus is on a low voltage level. This is used to control the third D-mode transistor D3 and the eleventh E-mode transistor E11 to disconnect the load circuit LC. The gate G of the eleventh E-mode transistor E11 can be addressed via an input current limiter IL, which is used here, because an E-mode PHEMT, unlike a D-mode PHEMT, has non-zero gate current when a high gate-source voltage $V_{gs}$ is applied. The current limiter can, for example, be implemented by means of a D-mode PHEMT with a voltage drop element between gate and source (similar to D1, E1, E2 in the inverter and D2, E6, E7 in the logic).

In the on-state the load circuit is connected. The on-state is obtained when the input voltages $V_{in1}, V_{in2}, V_{in3}$ are such that the output of the logic stage is low, and the output of the inverter stage is consequently high. The gate G of the ninth E-mode transistor E9 is therefore on a high voltage level, so that the ninth E-mode transistor E9 is conducting between source S and drain D. The gate G of the tenth E-mode transistor E10 is on a low voltage level, so that the tenth E-mode transistor E10 is non-conducting between source S and drain D. Then the output of the driver stage, the source S of the ninth E-mode transistor E9 and the drain D of the tenth E-mode transistor E10, is pulled to the high voltage level by the ninth E-mode transistor E9. This is used to control the third D-mode transistor D3 and the eleventh E-mode transistor E11 to connect the load circuit LC. In this operating state, the reverse leakage of the diode PN, which is preferably provided in the driver stage as shown, pulls the gate G of the ninth E-mode transistor E9 to the high level of the supply voltage $V_S$. As a result, the gate-source voltage of the ninth E-mode transistor E9 is maximal and the drain-source voltage of the ninth E-mode transistor E9 minimal. This means that virtually all of the supply voltage $V_S$ drops over the load circuit LC.

The low-current logic plus driver circuit allows for process tolerances, and reliably performs in a wide range of the supply voltage and largely irrespective of temperature variations. The idea of the invention is generally applicable to technologies providing D-mode and E-mode transistors.

What is claimed is:

1. A circuit, comprising:
    a logic stage that includes a current limiter comprising a D-mode feedback transistor having a source, a drain, a gate and a gate-source junction, the current limiter further comprising a component that generates a voltage drop and a feedback loop connecting the source of the D-mode feedback transistor to the gate of the D-mode feedback transistor via the component that generates the voltage drop;
    an inverter stage coupled to the logic stage and including a further current limiter comprising a further D-mode feedback transistor having a source, a drain, a gate and a gate-source junction, the further current limiter further comprising a further component that generates a voltage drop, and a further feedback loop connecting the source of the further D-mode feedback transistor to the gate of the further D-mode feedback transistor via the further component that generates the voltage drop; and
    a driver stage coupled to the inverter stage and comprising E-mode transistors having a source, a drain and a gate, the E-mode transistors being connected in a totem pole.

2. The circuit of claim 1, wherein the D-mode feedback transistors are not conducting between the source and the drain if a gate-source voltage that is applied between the gate and the source is more negative than a negative threshold voltage, and are conducting between the source and the drain otherwise, and wherein the E-mode transistors are conducting between the source and the drain if a gate-source voltage that is applied between the gate and the source is more positive than a positive threshold voltage, and are not conducting between the source and the drain otherwise.

3. The circuit of claim 1, further comprising at least one further E-mode transistor having a gate-source junction and/or a gate-drain junction generating the voltage drop in at least one of the current limiters.

4. The circuit according to claim 1, wherein the component that generates the voltage drop in at least one of the current limiters comprises at least two gate-source junctions of further E-mode transistors, the gate-source junctions being connected in series.

5. The circuit according to claim 1, wherein the inverter stage comprises a further E-mode transistor having a source, a drain and a gate, the further E-mode transistor coupled to the further current limiter.

6. The circuit according to claim 5, wherein the component that generates the voltage drop in at least one of the current limiters comprises at least two gate-source junctions of further E-mode transistors, the gate-source junctions being connected in series.

7. The circuit according to claim 6, wherein the drain of the further E-mode transistor of the inverter stage is connected with the gate of one of the E-mode transistors of the driver stage, and wherein the gate of the further E-mode transistor of the inverter stage is connected with the gate of another one of the E-mode transistors of the driver stage.

8. The circuit according to claim 4, further comprising a diode coupled between a supply voltage and the gate of one of the E-mode transistors of the driver stage.

9. The circuit according to claim 1, wherein the inverter stage inverts a logic signal from the logic stage, changing the signal from high to low or from low to high, and wherein the driver stage renders a low output signal if the signal from the inverter stage is low, and a high output signal if the signal from the inverter stage is high.

10. The circuit according to claim 1, wherein an output signal of the driver stage is used to switch a load circuit.

11. The circuit according to claim 9, further comprising:
    a further D-mode transistor having a source, a drain, and a gate; and
    a further E-mode transistor having a source, a drain, and a gate;
    wherein the load circuit is coupled between the drain of the further E-mode transistor and the source of the further D-mode transistor; and
    wherein the driver stage is connected to the gates of the further D-mode transistor and the further E-mode transistor.

12. The circuit according to claim 1, wherein the transistors are devices of a P-HEMT or BiFET technology in GaAs.

13. A circuit comprising:
    a combinational logic circuit having a plurality of logic inputs, a first reference terminal and a second reference terminal;
    a first D-mode transistor having a source, a drain and a gate, the gate coupled to the second reference terminal of the combinational logic circuit;
    a first component that generates a voltage drop having a first terminal coupled to the source of the first D-mode transistor and a second terminal coupled to the second reference terminal of the combinational logic circuit;
    a first E-mode transistor having a source, a drain and a gate, the gate coupled to the second reference terminal of the combinational logic circuit and the source coupled to the first reference terminal of the combinational logic circuit;
    a second D-mode transistor having a source, a drain and a gate, the gate coupled to the drain of the first E-mode transistor and the drain coupled to the drain of the first D-mode transistor;
    a second component that generates a voltage drop having a first terminal coupled to the source of the second D-mode transistor and a second terminal coupled to the drain of the first E-mode transistor;

a second E-mode transistor having a source, a drain and a gate, the gate coupled to the drain of the first E-mode transistor and the drain coupled to the drains of the first and second D-mode transistors; and a third E-mode transistor having a source, a drain and a gate, the gate coupled to the gate of the first E-mode transistor, the source coupled to the source of the first E-mode transistor and the first reference terminal of the combinational logic circuit, and the drain coupled to the source of the second E-mode transistor.

14. The circuit according to claim 13, wherein the circuit is implemented with GaAs.

15. The circuit according to claim 13, wherein the first reference terminal of the combinational logic circuit, the source of the first E-mode transistor and the source of the third E-mode transistor are coupled to a ground node and wherein the drains of the first and second D-mode transistors and the drain of the second E-mode transistor are coupled to a supply voltage node.

16. The circuit according to claim 13, wherein:
the first component that generates the voltage drop comprises a fourth E-mode transistor having a source, a drain and a gate, the gate being the first terminal and the source being the second terminal; and
the second component that generates the voltage drop comprises a fifth E-mode transistor having a source, a drain and a gate, the gate being the first terminal and the source being the second terminal.

17. The circuit according to claim 13, wherein:
the first component that generates the voltage drop comprises a fourth E-mode transistor having a source, a drain and a gate, the gate being the first terminal of the first component; and
a sixth E-mode transistor having a source, a drain and a gate, the source being the second terminal of the first component, wherein the gate of the sixth E-mode transistor is coupled to the source of the fourth E-mode transistor; and
the second component that generates the voltage drop comprises a fifth E-mode transistor having a source, a drain and a gate, the gate being the first terminal of the second component; and
a seventh E-mode transistor having a source, a drain and a gate, the source being the second terminal of the second component, wherein the gate of the seventh E-mode transistor is coupled to the source of the fifth E-mode transistor.

18. The circuit according to claim 13, further comprising a diode with a first terminal coupled to the drains of the first and second D-mode transistors and the drain of the second E-mode transistor and a second terminal coupled to the gate of the second E-mode transistor.

19. The circuit according to claim 13, further comprising:
a third D-mode transistor having a source, a drain and a gate, the drain coupled to the drains of the first and second D-mode transistors and the gate coupled to the source of the second E-mode transistor and the drain of the third E-mode transistor; and
an eighth E-mode transistor having a source, a drain and a gate, the gate coupled to the gate of the third D-mode transistor and the source coupled to the sources of the first and third E-mode transistors.

20. The circuit according to claim 19, further comprising a load coupled between the source of the third D-mode transistor and the drain of the eighth E-mode transistor.

21. A circuit using GaAs technology, the circuit comprising:
a combinational logic circuit having a plurality of logic inputs, a first reference terminal and a second reference terminal;
a first D-mode transistor having a source, a drain and a gate, the gate coupled to the second reference terminal of the combinational logic circuit;
a fourth E-mode transistor having a source, a drain and a gate, the gate coupled to source of the first D-mode transistor;
a sixth E-mode transistor having a source, a drain and a gate, the source being coupled to the second reference terminal of the combinational logic circuit;
a first E-mode transistor having a source, a drain and a gate, the gate coupled to the second reference terminal of the combinational logic circuit and the source coupled to the first reference terminal of the combinational logic circuit;
a second D-mode transistor having a source, a drain and a gate, the gate coupled to the drain of the first E-mode transistor and the drain coupled to the drain of the first D-mode transistor;
a fifth E-mode transistor having a source, a drain and a gate, the gate being coupled to the source of the second D-mode transistor;
a seventh E-mode transistor having a source, a drain and a gate, the source being coupled to the drain of the first E-mode transistor;
a second E-mode transistor having a source, a drain and a gate, the gate coupled to the drain of the first E-mode transistor and the drain coupled to the drains of the first and second D-mode transistors;
a third E-mode transistor having a source, a drain and a gate, the gate coupled to the gate of the first E-mode transistor, the source coupled to the source of the first E-mode transistor and the first reference terminal of the combinational logic circuit, and the drain coupled to the source of the second E-mode transistor;
a diode with a first terminal coupled to the drains of the first and second D-mode transistors and the drain of the second E-mode transistor and a second terminal coupled to the gate of the second E-mode transistor;
a third D-mode transistor having a source, a drain and a gate, the drain coupled to the drains of the first and second D-mode transistors and the gate coupled to the source of the second E-mode transistor and the drain of the third E-mode transistor; and
an eighth E-mode transistor having a source, a drain and a gate, the gate coupled to the gate of the third D-mode transistor and the source coupled to the sources of the first and third E-mode transistors.

* * * * *